(12) United States Patent
Okano et al.

(10) Patent No.: US 8,130,052 B2
(45) Date of Patent: Mar. 6, 2012

(54) SEMICONDUCTOR CIRCUIT BOARD AND SEMICONDUCTOR CIRCUIT

(75) Inventors: Takashi Okano, Osaka (JP); Masaya Nishimura, Shiga (JP); Shuhei Kawamura, Shiga (JP)

(73) Assignee: Daikin Industries Ltd., Osaka (JP)

( * ) Notice: Subject to any disclaimer, the term of this patent is extended or adjusted under 35 U.S.C. 154(b) by 1000 days.

(21) Appl. No.: 11/922,017

(22) PCT Filed: Jun. 13, 2005

(86) PCT No.: PCT/JP2005/010785
§ 371 (c)(1),
(2), (4) Date: Feb. 27, 2008

(87) PCT Pub. No.: WO2006/134629
PCT Pub. Date: Dec. 21, 2006

(65) Prior Publication Data
US 2009/0278593 A1    Nov. 12, 2009

(51) Int. Cl.
*H04B 3/38*    (2006.01)
*H03H 7/00*    (2006.01)
(52) U.S. Cl. .......... 333/12; 333/166; 333/184; 333/185
(58) Field of Classification Search .............. 333/12, 333/166, 184, 185
See application file for complete search history.

(56) References Cited

U.S. PATENT DOCUMENTS
6,642,811 B2 * 11/2003 Daniels et al. ............... 333/181
(Continued)

FOREIGN PATENT DOCUMENTS
JP        6-309420 A    11/1994
(Continued)

OTHER PUBLICATIONS
"Transistor Technology," CQ Publishing Co., Ltd., Oct. 2001, p. 202.
(Continued)

*Primary Examiner* — Robert Pascal
*Assistant Examiner* — Kimberly Glenn
(74) *Attorney, Agent, or Firm* — Birch, Stewart, Kolasch & Birch, LLP

(57) ABSTRACT

The present invention is intended to efficiently implement noise countermeasures for a semiconductor circuit board and for a semiconductor circuit. The present invention is constituted by a control substrate, and a semiconductor circuit connected to the control substrate. The semiconductor circuit includes a substrate, an integrated circuit group, and a noise countermeasure, and is separated from the control substrate. The integrated circuit group includes an integrated circuit as a noise source. The substrate has a stacked multilayer structure, and shifts the frequency of a noise generated by the integrated circuit group to the high frequency side. The noise countermeasure is connected between the integrated circuit group and the control substrate. The noise countermeasure is a filter for attenuating the high frequency of a noise.

20 Claims, 2 Drawing Sheets

U.S. PATENT DOCUMENTS

| | | |
|---|---|---|
| 2002/0011662 A1 | 1/2002 | Komiya et al. |
| 2002/0074669 A1 | 6/2002 | Watanabe et al. |
| 2002/0153532 A1 | 10/2002 | Sonobe et al. |
| 2004/0008531 A1 | 1/2004 | Arai et al. |
| 2004/0041201 A1* | 3/2004 | Sugiyama et al. ............ 257/316 |

FOREIGN PATENT DOCUMENTS

| | | |
|---|---|---|
| JP | 9-232790 A | 9/1997 |
| JP | 11-54861 A | 2/1999 |
| JP | 11-261180 A | 9/1999 |
| JP | 2001-102789 A | 4/2001 |
| JP | 2002-76537 A | 3/2002 |
| JP | 2002-184933 A | 6/2002 |
| JP | 2003-163466 A | 6/2003 |

OTHER PUBLICATIONS

Miyazaki, "1041 Qs and As about Noise Countermeasures," Integrated Systems Institute, Nov. 15, 1991. pp. 88-89.

* cited by examiner

US 8,130,052 B2

SEMICONDUCTOR CIRCUIT BOARD AND SEMICONDUCTOR CIRCUIT

TECHNICAL FIELD

The present invention relates to a semiconductor circuit board and a semiconductor circuit, and is applicable for example to design techniques.

BACKGROUND ART

Air conditioners and the like are equipped for example with a semiconductor circuit board for controlling the operations of the air conditioners. A conventional semiconductor circuit board is formed by an integrated circuit group, a control circuit thereof, a power circuit and the like arranged on the same board. The integrated circuit group includes for example a high-speed switching element, a transmitter/receiver circuit and others. The control circuit includes for example a microprocessor and others, and is operative to control the integrated circuit group. The power circuit is operative to supply power to the integrated circuit group.

Patent publication 1 discloses a technique for simulating a radiation noise. Non-patent publication 1 introduces a technique for reducing a noise generated by a power source by using an inductor such as ferrite beads or a coil, and a by-pass capacitor. Non-patent publication 2 introduces a technique for reducing a noise generated by an electronic device formed by a substrate with a stacked multilayer structure.

Patent Publication 1: Japanese Patent Application Laid-Open No. 6-309420 (1994)

Non-Patent Publication 1: "Transistor Technology" published by CQ Publishing Co., Ltd., October 2001 issue, p. 202

Non-Patent Publication 2: "101 Qs and As about Noise Countermeasures" written by Seiichi Miyazaki, published by Integrated Systems Institute, pp. 88-89

DISCLOSURE OF INVENTION

Problems to be Solved by the Invention

A trend toward higher performance of air conditioners and the like in recent years results in the enhancement of the processing speed of a semiconductor circuit board such as the switching speed of a high-speed switching element. On the other hand, the enhancement of the processing speed is accompanied by an unwanted noise generated by the high-speed switching element and others. An unwanted noise may exert influence upon the other circuits in the semiconductor circuit board or upon devices arranged around air conditioners and the like.

A noise can be reduced for example by the technique introduced in non-patent, publication 1 or 2 identified above. However, circuits constituting the conventional semiconductor circuit board are arranged on the same board. This means that noise countermeasures should be prepared for each semiconductor circuit board, disadvantageously resulting in the increase of development cost, for example.

Noise countermeasures for the conventional semiconductor circuit board are taken generally at a late stage of a design phase, so required noise countermeasures cannot be implemented with a high degree of efficiency.

The present invention has been made in view of the above-discussed circumstances. The present invention is intended to efficiently provide noise countermeasures for a semiconductor circuit board, and to realize development cost savings and component cost savings.

Means for Solving Problems

A first semiconductor circuit board according to the present invention comprises: a control substrate (1); and a semiconductor circuit (2) connected to the control substrate. The semiconductor circuit includes: a substrate (21); an integrated circuit group (22) mounted on the substrate; and a noise countermeasure (23) mounted on the substrate. The integrated circuit group includes an integrated circuit (221) as a noise source, and is separated from the control substrate.

According to a second semiconductor circuit board of the present invention, in the first semiconductor circuit board, the integrated circuit group (22) and the control substrate (1) are connected through the noise countermeasure (23).

According to a third semiconductor circuit board of the present invention, in the first or second semiconductor circuit board, the substrate (21) has a stacked multilayer structure including: a substrate (31) at a first level on which the integrated circuit group (22) is mounted; and a plurality of substrates (32, 33) at a second level arranged inwardly relative to the substrate at a first level, the plurality of substrates at a second level being provided with patterns formed thereon for receiving different fixed potentials.

According to a fourth semiconductor circuit board of the present invention, in any one of the first, second and third semiconductor circuit boards, the noise countermeasure (23) attenuates the high frequency component of a noise generated by the integrated circuit group (22).

According to a fifth semiconductor circuit board of the present invention, in any one of the first to fourth semiconductor circuit boards, the noise countermeasure (23) is a filter.

According to a sixth semiconductor circuit board of the present invention, in the first semiconductor circuit board, the semiconductor circuit further includes a second noise countermeasure (231) mounted on the substrate (21). The substrate (21) has a stacked multilayer structure including: a substrate (31) at a first level on which the integrated circuit group (22) is mounted; and a plurality of substrates (32, 33) at a second level arranged inwardly relative to the substrate at a first level, the plurality of substrates at a second level being provided with patterns formed thereon for receiving different fixed potentials. The integrated circuit group and the patterns for receiving the fixed potentials are connected through the second noise countermeasure.

According to a seventh semiconductor circuit board of the present invention, in the sixth semiconductor circuit board, the noise countermeasure (23) is connected to the patterns for receiving the fixed potentials.

According to an eighth semiconductor circuit board of the present invention, in the sixth or seventh semiconductor circuit board, the noise countermeasure (23) and the second noise countermeasure (231) attenuate the high frequency component of a noise generated by the integrated circuit group (22).

According to a ninth semiconductor circuit board of the present invention, in any one of the sixth, seventh and eighth semiconductor circuit boards, the noise countermeasure (23) and the second noise countermeasure (231) are filters.

According to a tenth semiconductor circuit board of the present invention, in any one of the first to ninth semiconductor circuit boards, the integrated circuit (221) includes a high-speed switching element.

A first semiconductor circuit (2) according to the present invention is capable of being connected to a control substrate (1). The semiconductor circuit comprises: a substrate (21); an integrated circuit group (22) mounted on the substrate; and a noise countermeasure (23) mounted on the substrate. The integrated circuit group includes an integrated circuit (221) as a noise source, and is separated from the control substrate.

According to a second semiconductor circuit of the present invention, in the first semiconductor circuit, the integrated circuit group (22) and the control substrate (1) can be connected through the noise countermeasure (23).

According to a third semiconductor circuit of the present invention, in the first or second semiconductor circuit, the substrate (21) has a stacked multilayer structure including: a substrate (31) at a first level on which the integrated circuit group (22) is mounted; and a plurality of substrates (32, 33) at a second level arranged inwardly relative to the substrate at a first level, the plurality of substrates at a second level being provided with patterns formed thereon for receiving different fixed potentials.

According to a fourth semiconductor circuit of the present invention, in any one of the first, second and third semiconductor circuits, the noise countermeasure (23) attenuates the high frequency component of a noise generated by the integrated circuit group (22).

According to a fifth semiconductor circuit of the present invention, in any one of the first to fourth semiconductor circuits, the noise countermeasure (23) is a filter.

According to a sixth semiconductor circuit of the present invention, the first semiconductor circuit further comprises a second noise countermeasure (231) mounted on the substrate (21). In the sixth semiconductor circuit, the substrate (21) has a stacked multilayer structure including: a substrate (31) at a first level on which the integrated circuit group (22) is mounted; and a plurality of substrates (32, 33) at a second level arranged inwardly relative to the substrate at a first level, the plurality of substrates at a second level being provided with patterns formed thereon for receiving different fixed potentials. The integrated circuit group and the patterns for receiving the fixed potentials are connected through the second noise countermeasure.

According to a seventh semiconductor circuit of the present invention, in the sixth semiconductor circuit, the noise countermeasure (23) is connected to the patterns for receiving the fixed potentials.

According to an eighth semiconductor circuit of the present invention, in the sixth or seventh semiconductor circuit, the noise countermeasure (23) and the second noise countermeasure (231) attenuate the high frequency component of a noise generated by the integrated circuit group (22).

According to a ninth semiconductor circuit of the present invention, in any one of the sixth, seventh and eighth semiconductor circuits, the noise countermeasure (23) and the second noise countermeasure (231) are filters.

According to a tenth semiconductor circuit of the present invention, in any one of the first to ninth semiconductor circuits, the integrated circuit (221) includes a high-speed switching element.

Effect of the Invention

According to the first semiconductor circuit board of the present invention, the integrated circuit group including the integrated circuit as a noise source is separated from the control substrate. Thus, by the presence of the noise countermeasure responsible for noise removal, the propagation of a noise to the control substrate is suppressed. Further, the semiconductor circuit board may be designed by retrofitting the semiconductor circuit thereto that is equipped with the noise countermeasure. As a result, noise countermeasures for the semiconductor circuit board can be implemented with a high degree of efficiency, resulting in the reduction of development cost.

According to the second semiconductor circuit board or to the second semiconductor circuit of the present invention, the noise countermeasure prevents the propagation of a noise generated by the integrated circuit group before this noise reaches the control substrate.

According to the third semiconductor circuit board or to the third semiconductor circuit of the present invention, the frequency of a noise generated by the semiconductor circuit is shifted to the high frequency side. Thus the noise countermeasure is required only to remove the high frequency component of a noise. As a result, the noise countermeasure can be easily designed.

According to the fourth semiconductor circuit board or to the fourth semiconductor circuit of the present invention, no propagation of the high frequency noise occurs from the semiconductor circuit.

According to the fifth semiconductor circuit board or to the fifth semiconductor circuit of the present invention, a filter is responsible for noise removal. Then the fifth semiconductor circuit board is applicable in any one of the first to fourth semiconductor circuit boards, and the fifth semiconductor circuit is applicable in any one of the first to fourth semiconductor circuits.

According to the sixth semiconductor circuit board or to the sixth semiconductor circuit of the present invention, the frequency of a noise generated by the semiconductor circuit is shifted to the high frequency side. Thus the noise countermeasure and the second noise countermeasure are required only to remove the high frequency component of a noise. As a result, these noise countermeasures can be easily designed. Further, the propagation of a noise from the integrated circuit group to the patterns for receiving fixed potentials can be suppressed to a greater degree by the presence of the second noise countermeasure.

According to the seventh semiconductor circuit board or to the seventh semiconductor circuit of the present invention, the propagation of a noise from the patterns for receiving fixed potentials to the control substrate can be suppressed.

According to the eighth semiconductor circuit board or to the eighth semiconductor circuit of the present invention, the frequency of a noise is shifted to the high frequency side at the semiconductor circuit. Further, the noise countermeasure and the second noise countermeasure attenuate the high frequency component of a noise to thereby suppress noise propagation from the semiconductor circuit.

According to the ninth semiconductor circuit board or to the ninth semiconductor circuit of the present invention, filters are responsible for noise removal. Then the ninth semiconductor circuit board is applicable in any one of the sixth, seventh and eighth semiconductor circuit boards, and the ninth semiconductor circuit is applicable in any one of the sixth, seventh and eighth semiconductor circuits.

According to the tenth semiconductor circuit board or to the tenth semiconductor circuit of the present invention, the high-speed switching element is a noise source. Then the tenth semiconductor circuit board is applicable in any one of the first to ninth semiconductor circuit boards, and the tenth semiconductor circuit is applicable in any one of the first to ninth semiconductor circuits.

According to the first semiconductor circuit of the present invention, the integrated circuit group including the integrated circuit as a noise source is separated from the control substrate. Thus, by the presence of the noise countermeasure responsible for noise removal, the propagation of a noise to the control substrate is suppressed. Further, the first semiconductor circuit may be connected to various types of control substrates that are not required to be equipped with noise countermeasures. As a result, the first semiconductor circuit can be adopted for use in the design for example of a semiconductor circuit board by retrofitting the first semiconductor circuit.

These and other objects, features, aspects and advantages of the present invention will become more apparent from the following detailed description of the present invention when taken in conjunction with the accompanying drawings.

BEST MODE FOR CARRYING OUT THE INVENTION

Figure 1:
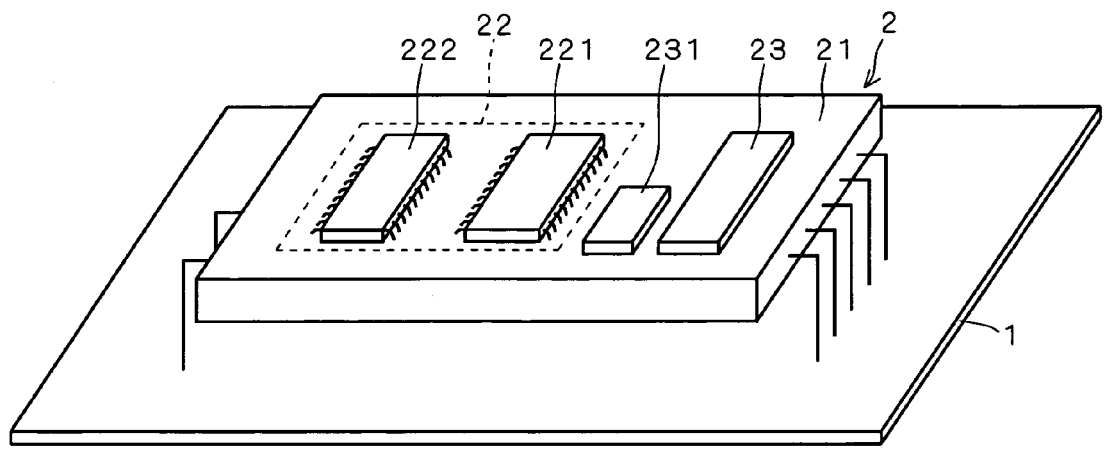
FIG. 1 is a perspective view conceptually showing a semiconductor circuit board according to the present invention.

FIG. 1 is a perspective view conceptually showing the structure of a semiconductor circuit board according to the present invention. This semiconductor circuit board comprises a control substrate 1, and a semiconductor circuit 2 connected to the control substrate 1. The control substrate 1 includes for example a microprocessor, and is operative to control the semiconductor circuit 2. The semiconductor circuit 2 includes a substrate 21, an integrated circuit group 22, and noise countermeasures 23, 231. The semiconductor circuit 2 is separated from the control substrate 1. The integrated circuit group 22 and the noise countermeasures 23, 231 are mounted on the substrate 21.

The integrated circuit group 22 includes an integrated circuit as a noise source such as a high-speed switching element 221. The integrated circuit group 22 may include other integrated circuits such as a transmitter/receiver circuit 222. The semiconductor circuit 2 is separated from the control substrate 1 as discussed, meaning that the integrated circuit group 22 is also separated from the control substrate 1.

Figure 2:
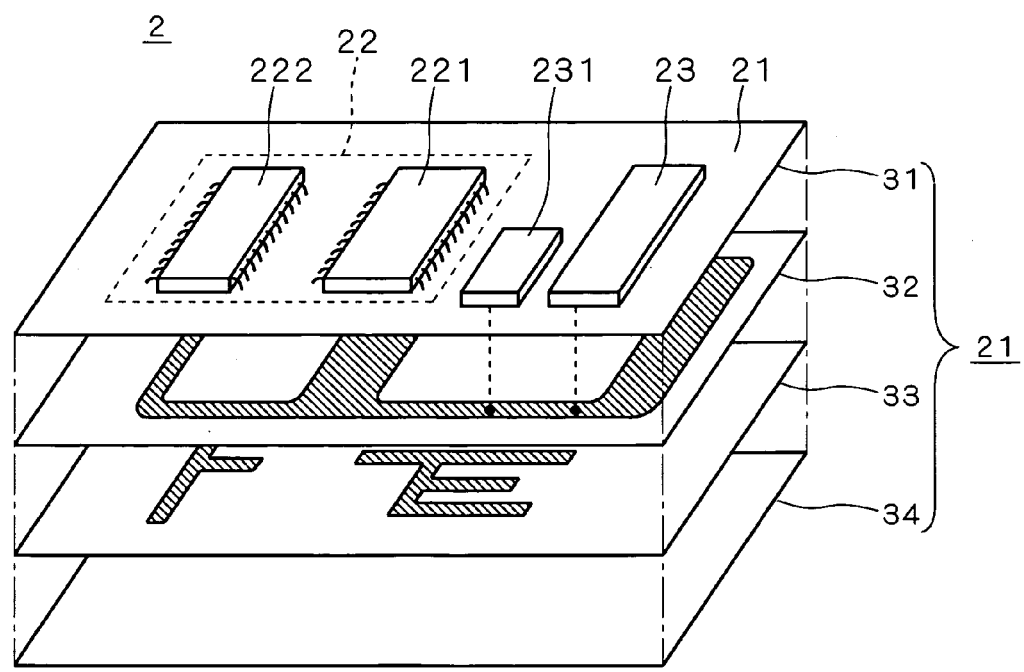
FIG. 2 is a perspective view conceptually showing a substrate 21 with a stacked multilayer structure.

FIG. 2 is a perspective view showing the structure of the substrate 21. The substrate 21 has a stacked multilayer structure formed by substrates 31, 32, 33 and 34 stacked in this order. In FIG. 2, these substrates are shown to be separated from each other in a direction in which these substrates are stacked for the convenience of illustration in order to clearly show a pattern formed on each substrate.

The substrate 31 forms an outermost layer of the substrate 21, and holds the integrated circuit group 22 and the noise countermeasures 23, 231 thereon. Other circuits except those of the integrated circuit group 22 may be formed on the substrate 31. Either the noise countermeasure 23 or 231, or both of the noise countermeasures 23 and 231 may be mounted on the substrate 34.

The substrates 32 and 33 are arranged inwardly relative to the substrate 31, and are adjacent to each other, for example.

Patterns for receiving different fixed potentials are formed on the substrates 32 and 33. In FIG. 2, these patterns are formed on the respective surfaces of the substrates 32 and 33 that face the substrate 31. As an example, the pattern formed on the substrate 32 is connected to a ground, whereas the pattern formed on the substrate 33 is connected to an external power source.

These substrates are arranged in stacked relationship so the circuits formed on these substrates are interconnected, whereby the substrate 21 is operative to perform a predetermined function such as a communication function.

In the above-described stacked multilayer structure, patterns formed on the substrates 32 and 33 are employed as electrodes. These electrodes hold therebetween an insulation layer to form a capacitor. Then a noise generated for example by the high-speed switching element 221 can be shifted to the high frequency side. Thus the noise countermeasures 23 and 231 are required only to remove the high frequency component of a noise. As a result, the noise countermeasures 23 and 231 can be easily designed.

By way of example, if the substrate 21 does not have a stacked multilayer structure, the propagation of a high frequency noise from the semiconductor circuit 2 can be still suppressed by the presence of the noise countermeasures 23 and 231. However, in view of the above-mentioned ease of noise removal, the substrate 21 desirably has a stacked multilayer structure.

Figure 3:
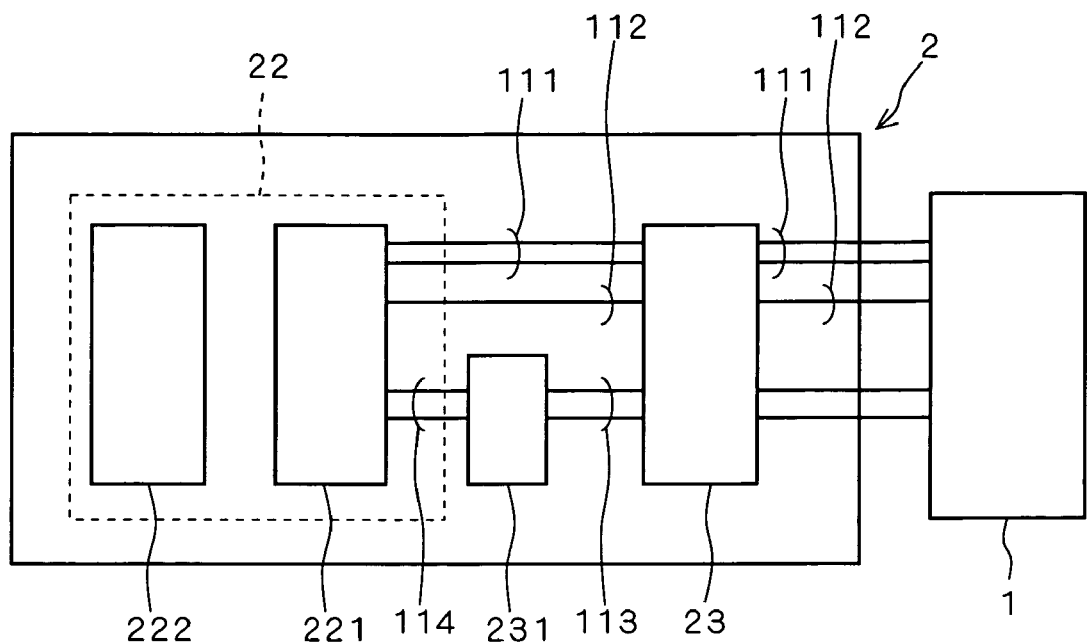
FIG. 3 is a block diagram conceptually showing the semiconductor circuit board.

FIG. 3 is a block diagram conceptually showing the semiconductor circuit board shown in FIGS. 1 and 2. The noise countermeasure 23 is formed by ferrite beads or a chip inductor, for example, and is connected between the integrated circuit group 22 and the control substrate 1. In FIG. 3, the high-speed switching element 221 in the integrated circuit group 22 is connected to the noise countermeasure 23. An interconnect line for connecting the high-speed switching element 221 and the control substrate 1 through the noise countermeasure 23 includes for example a signal line 111 and a power line 112.

When the substrate 21 has a stacked multilayer structure as discussed above, the noise countermeasures 23 is required only to be a filter intended especially for the attenuation of the high frequency of a noise. The noise countermeasures 23 is connected between the integrated circuit group 22 and the control substrate 1, so a noise generated by the integrated circuit group 22 is removed before reaching the control substrate 1. In other words, the propagation of a high frequency noise from the semiconductor circuit 2 is prevented while the generation of a low frequency noise by the semiconductor circuit 2 is suppressed.

The noise countermeasure 231 is formed by ferrite beads or a chip inductor, for example, and is connected between the integrated circuit group 22 and the pattern formed on the substrate 32 for receiving a fixed potential. In FIG. 3, the high-speed switching element 221 in the integrated circuit group 22 is connected though an interconnect line 114 to the noise countermeasure 231. The pattern formed on the substrate 32 for receiving a fixed potential is represented by reference numeral 113.

The noise countermeasure 23 is connected to the pattern formed on the substrate 32 for receiving a fixed potential.

In FIG. 2, the connections between the noise countermeasures 23, 231 and the pattern formed on the substrate 32 for receiving a fixed potential are represented by dashed lines.

When the substrate 21 has a stacked multilayer structure as discussed above, the noise countermeasure 231 is also required only to be a filter intended especially for the attenuation of the high frequency of a noise. The noise countermesure 231 is connected between the integrated circuit group 22 and the pattern for receiving a fixed potential, so the propagation of a noise to this pattern is suppressed.

According to the disclosure described above, the integrated circuit group 22 including the high-speed switching element 221 as a noise source and the control substrate 1 are separated. Thus, by the presence of the noise countermeasure 23 responsible for noise removal, the propagation of a high frequency noise to the control substrate 1 is suppressed. Further, as a result of the above-discussed stacked multilayer structure applied to the substrate 21, the generation of a low frequency noise by the semiconductor circuit 2 is suppressed. Still further, the semiconductor circuit board may be designed by retrofitting the semiconductor circuit 2 thereto that is equipped with the noise countermeasure. Thus noise countermeasures for the semiconductor circuit board can be implemented with a high degree of efficiency, resulting in the reduction of development cost.

In the present embodiment, the semiconductor circuit board is described as comprising the control substrate 1 and the semiconductor circuit 2. Alternatively, the semiconductor circuit 2 alone may constitute the present invention. In this case, the semiconductor circuit 2 is connectable to an external circuit capable of controlling the semiconductor circuit 2 such as the control substrate 1. Thus, the semiconductor circuit 2 can be adopted for use in the design for example of a semiconductor circuit board that allows retrofitting.

While the invention has been shown and described in detail, the foregoing description is in all aspects illustrative and not restrictive. It is therefore understood that numerous modifications and variations can be devised without departing from the scope of the invention.

The invention claimed is:

1. A semiconductor circuit board, comprising:
    a control substrate; and
    a semiconductor circuit connected to said control substrate, said semiconductor circuit including:
        a substrate;
        an integrated circuit group mounted on said substrate; and
        a noise countermeasure mounted on said substrate,
        said integrated circuit group including an integrated circuit as a noise source, and being separated from said control substrate,
    wherein said substrate has a stacked multilayer structure including:
    a substrate at a first level on which said integrated circuit group is mounted; and
    a plurality of substrates at a second level arranged inwardly relative to said substrate at a first level, said plurality of substrates at a second level being provided with patterns formed thereon for receiving different fixed potentials.

2. The semiconductor circuit board according to claim 1, wherein said noise countermeasure attenuates the high frequency component of a noise generated by said integrated circuit group.

3. The semiconductor circuit board according to claim 2, wherein said noise countermeasure is a filter.

4. The semiconductor circuit board according to claim 3, wherein said integrated circuit group and said control substrate are connected through said noise countermeasure.

5. The semiconductor circuit board according to claim 2, wherein said integrated circuit group and said control substrate are connected through said noise countermeasure.

6. The semiconductor circuit board according to claim 1, wherein said semiconductor circuit further includes a second noise countermeasure mounted on said substrate,
    wherein said substrate has a stacked multilayer structure including:
    a substrate at a first level on which said integrated circuit group is mounted; and
    a plurality of substrates at a second level arranged inwardly relative to said substrate at a first level, said plurality of substrates at a second level being provided with patterns formed thereon for receiving different fixed potentials, and
    wherein said integrated circuit group and said patterns for receiving said fixed potentials are connected through said second noise countermeasure.

7. The semiconductor circuit board according to claim 6, wherein said noise countermeasure is connected to said patterns for receiving said fixed potentials.

8. The semiconductor circuit board according to claim 6, wherein said noise countermeasure and said second noise countermeasure attenuate a high frequency component of a noise generated by said integrated circuit group.

9. The semiconductor circuit board according to claim 8, wherein said noise countermeasure and said second noise countermeasure are filters.

10. The semiconductor circuit board according to claim 6, wherein said integrated circuit includes a high-speed switching element.

11. A semiconductor circuit board, comprising:
    a control substrate; and
    a semiconductor circuit connected to said control substrate, said semiconductor circuit including:
        a substrate;
        an integrated circuit group mounted on said substrate; and
        a noise countermeasure mounted on said substrate,
        said integrated circuit group including an integrated circuit as a noise source, and being separated from said control substrate,
    wherein said integrated circuit includes a high-speed switching element.

12. A semiconductor circuit capable of being connected to a control substrate, said semiconductor circuit comprising:
    a substrate;
    an integrated circuit group mounted on said substrate; and
    a noise countermeasure mounted on said substrate,
    said integrated circuit group including an integrated circuit as a noise source, and being separated from said control substrate,
    wherein said substrate has a stacked multilayer structure includes:
    a substrate at a first level on which said integrated circuit group is mounted; and
    a plurality of substrates at a second level arranged inwardly relative to said substrate at a first level,
    said plurality of substrates at a second level being provided with patterns formed thereon for receiving different fixed potentials.

13. The semiconductor circuit according to claim 12, wherein said noise countermeasure attenuates a high frequency component of a noise generated by said integrated circuit group.

14. The semiconductor circuit according to claim 13, wherein said noise countermeasure is a filter.

15. The semiconductor circuit according to claim 12, further comprising a second noise countermeasure mounted on said substrate,
    wherein said substrate has a stacked multilayer structure including:

a substrate at a first level on which said integrated circuit group is mounted; and a plurality of substrates at a second level arranged inwardly relative to said substrate at a first level, said plurality of substrates at a second level being provided with patterns formed thereon for receiving different fixed potentials, and wherein said integrated circuit group and said patterns for receiving said fixed potentials are connected through said second noise countermeasure.

16. The semiconductor circuit according to claim 15,
wherein said noise countermeasure is connected to said patterns for receiving said fixed potentials.

17. The semiconductor circuit according to claim 15,
wherein said noise countermeasure and said second noise countermeasure attenuate a high frequency component of a noise generated by said integrated circuit group.

18. The semiconductor circuit according to claim 17,
wherein said noise countermeasure and said second noise countermeasure are filters.

19. The semiconductor circuit according to claim 15,
wherein said integrated circuit includes a high-speed switching element.

20. A semiconductor circuit capable of being connected to a control substrate, said semiconductor circuit comprising:
a substrate;
an integrated circuit group mounted on said substrate; and
a noise countermeasure mounted on said substrate,
said integrated circuit group including an integrated circuit as a noise source, and being separated from said control substrate,
wherein said integrated circuit includes a high-speed switching element.

* * * * *